United States Patent [19]

Kitamura et al.

[11] 4,276,604
[45] Jun. 30, 1981

[54] AUTOMATIC ATTENUATION CIRCUIT

[75] Inventors: Masatsugu Kitamura; Hideo Onoye; Masami Yamazaki, all of Yokohama, Japan

[73] Assignee: Victor Company of Japan, Limited, Yokohama, Japan

[21] Appl. No.: 41,820

[22] Filed: May 23, 1979

[30] Foreign Application Priority Data

May 28, 1978 [JP] Japan .................................. 53-63610

[51] Int. Cl.³ ............................................. H03G 3/20
[52] U.S. Cl. .................................... 364/480; 364/571; 360/67; 307/264; 330/144; 330/284
[58] Field of Search .................. 364/480, 571; 360/67; 330/144, 86, 145, 284; 333/81 R; 323/8.94 R; 328/168, 169; 307/264; 340/347 DD

[56] References Cited
U.S. PATENT DOCUMENTS

| 3,132,308 | 5/1964 | Munson et al. | 330/144 |
| 3,835,400 | 9/1974 | Briscoe | 330/144 |
| 3,904,971 | 9/1975 | Delagrange | 330/145 |
| 3,969,683 | 7/1976 | Fabricius | 330/144 |
| 4,016,483 | 4/1977 | Rudin | 323/94 R |
| 4,016,557 | 4/1977 | Zitelli et al. | 330/86 |
| 4,091,380 | 5/1978 | Yu | 340/347 DD |
| 4,112,384 | 9/1978 | Buchberger | 330/284 |

Primary Examiner—Charles E. Atkinson
Assistant Examiner—Gary Chin
Attorney, Agent, or Firm—Lowe, King, Price & Becker

[57] ABSTRACT

An automatic attenuation circuit comprises a variable loss attenuation circuit that drives circuitry for detecting the level of the output signal of the variable loss attenuation circuit. The level detector drives a periodically reset integrator, which in turn feeds a signal to a comparator, also responsive to a reference. A control circuit responsive to the output signal of the comparator controls the attenuation factor of the variable loss attenuation circuit. The control circuit, which may be a microcomputer, is so programmed that the attenuation factor of the variable loss attenuation circuit is stepwisely increased until the level of the output signal of the variable loss attenuation circuit becomes equal to or below a predetermined level.

9 Claims, 4 Drawing Figures

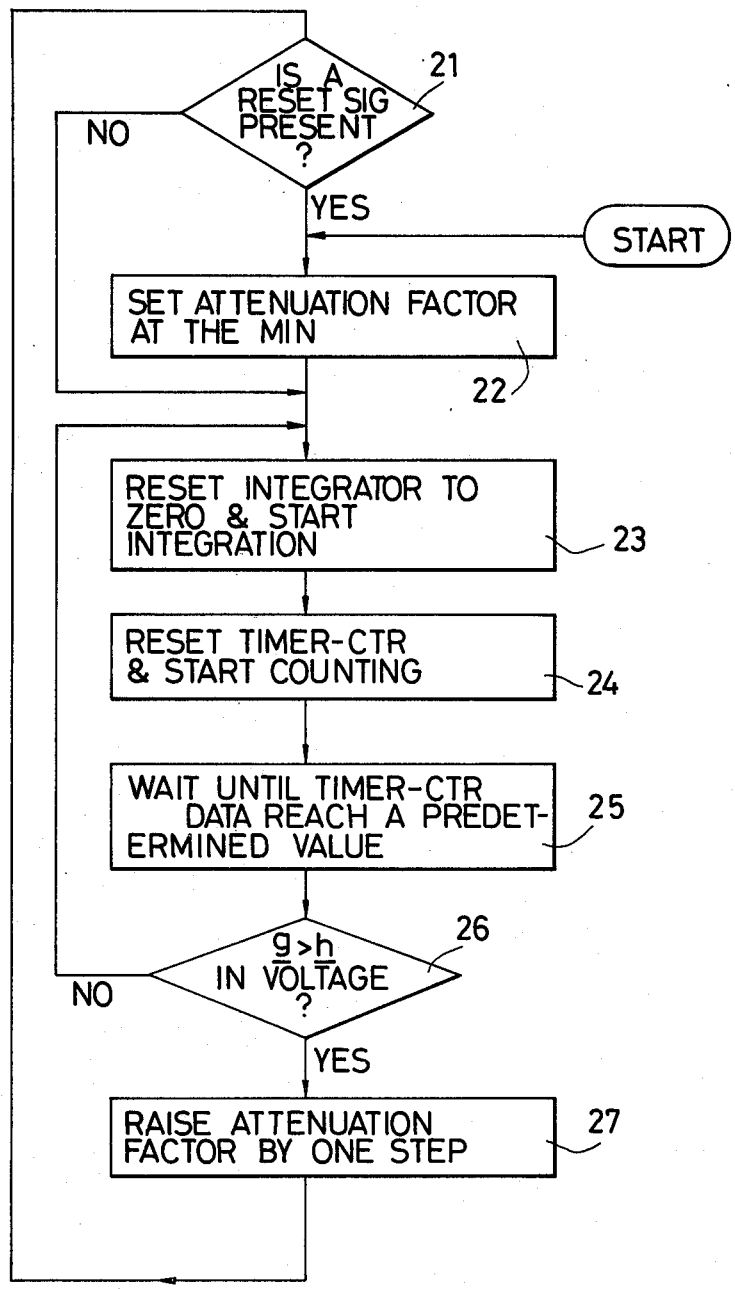

AUTOMATIC ATTENUATION CIRCUIT

FIELD OF THE INVENTION

This invention generally relates to an automatic gain control circuit. More particularly, the present invention relates to automatic attenuation circuit, including a periodically resettable integrator.

BACKGROUND OF THE INVENTION

When recording on a magnetic tape, an audio signal selected from various program sources, it is necessary to adjust the level of an input audio signal in such a manner that the dynamic range of a recording magnetic tape is effectively used. Some conventional tape recorders, therefore, include automatic gain control (AGC) circuits to automatically adjust the level of the input signals prior to recording. However, such a conventional automatic gain control circuit is apt to reduce the dynamic range of the input signal to an extent which is unnatural. Therefore, the conventional automatic gain control circuit is not suitable for recording audio signals, such as music signals, which are required to be recorded and reproduced faithfully. In other words conventional gain control circuits which have been used in tape recorders hitherto are disadvantageous for recording music signals and the like.

Hence, when it is intended to record music signals and the like, the level of the tape recorder input signal has to be manually adjusted, without using such an automatic gain control circuit, so as to be within the dynamic range of a recording tape on which the input signal is to be recorded. The level of the input signal is typically adjusted by manipulating a variable resistor while watching a VU meter of the tape recorder to enable visual monitoring of the adjustment. This is of course troublesome and time consuming and therefore, an inherent drawback to the prior art or conventional arrangement.

SUMMARY OF THE INVENTION

This invention has been developed to remove the above described disadvantages and drawbacks inherent to conventional tape recorders.

It is, therefore, an object of the present invention to provide an automatic attenuation circuit in which the level of an input signal is so adjusted that the dynamic range of the input signal is maintained within a predetermined range.

Another object of the present invention is to provide an automatic attenuation circuit in which the level of an input signal is adjusted by setting the most suitable attenuation factor in accordance with the level of the input signal.

A further object of the present invention is to provide an automatic attenuation circuit in which the level of an input signal is set as high as possible in such a manner that distortion does not occur.

A still further object of the present invention is to provide an automatic attenuation circuit in which the level of an input signal is adjusted by raising the attenuation factor as soon as the level of the input signal increases.

According to the present invention there is provided an automatic attenuation circuit comprising; (a) a variable loss attenuation circuit for attenuating the level of an input signal; (b) first means for detecting the level of the output signal of the variable loss attenuation circuit, the first means producing a signal when the magnitude of the variable loss attenuation circuit output signal is above a predetermined value; to achieve the result of resetting the attenuation factor as soon as the level of the input signal increases, the level detector includes a periodically reset integrator responsive to a level detector and having an output that is compared against a reference; and (c) second means for producing a control signal in response to the output signal of the first means, the attenuation factor of the variable loss attenuation circuit being stepwise controlled in response to each indication that the reset integrator output exceeds the reference until the level of the output signal of the variable loss attenuation circuit becomes equal to or below the predetermined value.

BRIEF DESCRIPTION OF THE DRAWINGS

These and other objects and features of the present invention will become more readily apparent from the following detailed description of the preferred embodiment taken in conjunction with the accompanying drawings in which:

FIG. 4 is a flow chart of the programmed operation of the control circuit shown in FIG. 1.

DETAILED DESCRIPTION OF THE PREFERRED EMBODIMENT

Figure 1:
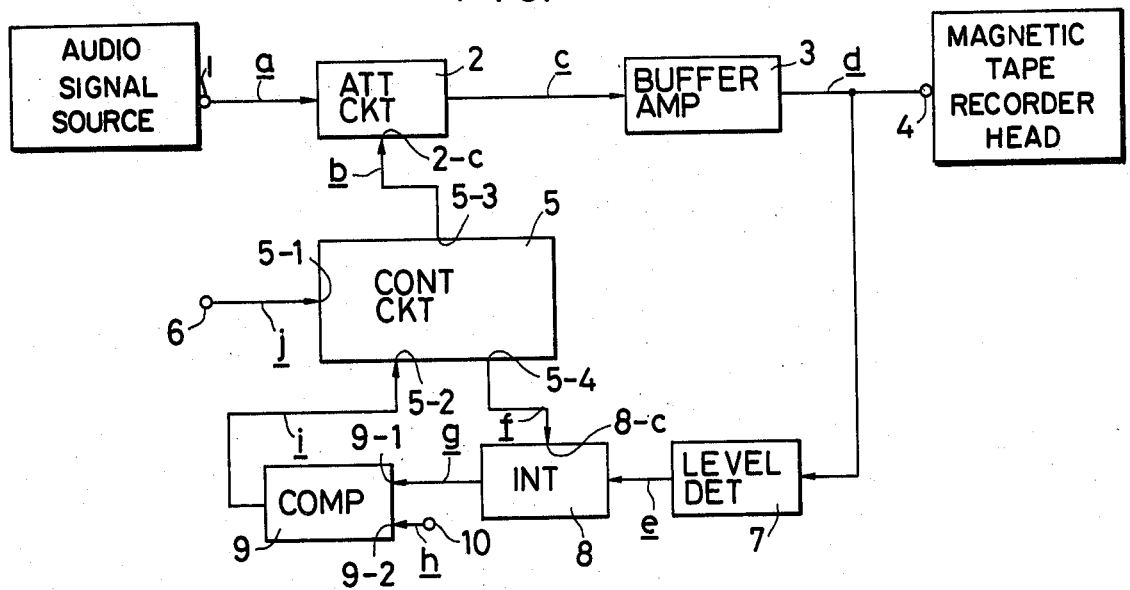
FIG. 1 is a schematic block diagram of a preferred embodiment of the automatic attenuation circuit according to the present invention.

Reference is made to FIG. 1 wherein a preferred embodiment of the tape recorder automatic attenuation circuit according to the present invention is is schematically illustrated as including a variable loss attenuation circuit 2, a buffer amplifier 3, a level detector 7, an integrator 8, a comparator 9, and a control circuit 5. An input terminal 1 is responsive to an input audio signal a and is connected to an input of the variable loss attenuation circuit 2, having an output connected to an input of the buffer amplifier 3. The variable loss attenuation circuit 2 has a control terminal 2-C to receive a first control signal b from a first output 5-3 of the control circuit 5. The variable loss attenuation circuit 2 attenuates the level of the input audio signal a in accordance with the first control signal b. The detailed arrangement of the variable loss attenuation circuit 2 is described infra in conjunction with FIG. 2.

The buffer amplifier 3 has an output terminal 4 connected to an input of the level detector 7. An output audio signal d derived from the output of the buffer amplifier 3 is recorded by means of a level detector head on a magnetic tape. The output of the level detector 7 is connected to an input of the integrator 8 which has a control terminal 8-C and an output connected to a first input 9-1 of the comparator 9. The integrator 9 is arranged to be controlled by a second control signal f applied from a second output 5-4 of the control circuit 5. The comparator 9 has a second input 9-2 connected to an external voltage sourse 10, which may be a suitable voltage divider, to receive a reference voltage from signal source h that is compared with the output signal g of the integrator 8.

The control circuit 5 has first and second inputs 5-1 and 5-2 and the above mentioned first and second outputs 5-3 and 5-4. The first input 5-1 of the control circuit 5 is responsive to a reset signal j which may be produced by a reset signal generator (not shown). The reset signal j may be produced by manipulating a switch or a key connected to the reset signal generator. The second input 5-2 of the control circuit 5 is connected to the output of the comparator 9 to receive the output signal i which is indicative of the result of the comparison. The control circuit 5 may be a logic circuit or a microcomputer.

Figure 2:
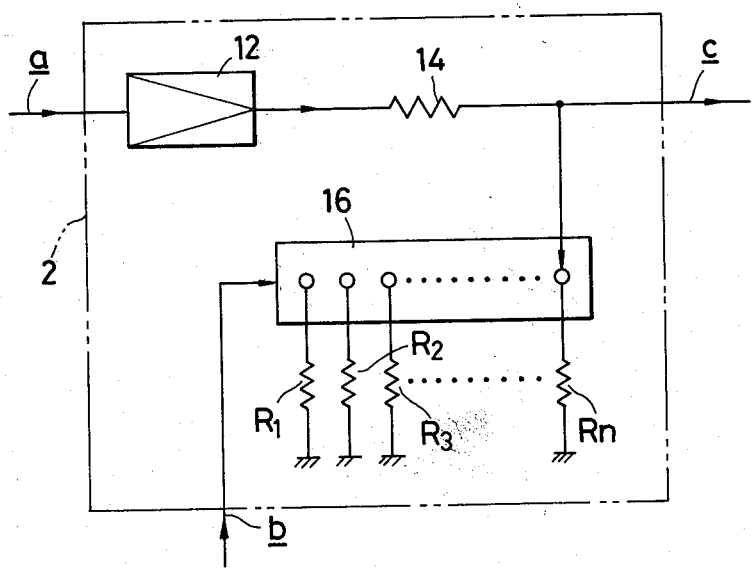
FIG. 2 is a schematic circuit diagram of the variable loss attenuation circuit shown in FIG. 1.

FIG. 2 is a detailed circuit diagram of the variable loss attenuation circuit 2 shown in FIG. 1. The variable loss attenuation circuit 2 comprises an amplifier 12, a resistor 14, an analog multiplexer 16 (analog selector), and a series of resistors R1 to Rn. The amplifier 12 is responsive to an input audio signal a to amplify the same to an extent that a possible lowest level input signal is sufficiently amplified to be properly recorded on a magnetic recording tape via a recording head. The output of the amplifier 12 is connected via the resistor 14 to the output (no numeral) of the analog multiplexer 16. The analog multiplexer 16 is schematically shown to have a movable contact arranged to be in contact with one of a plurality of stationary contacts for illustrative purpose. The movable contact is connected to the resistor 14, while the stationary contacts are respectively connected via resistors R1 to Rn to ground. The connection of the movable contact is controlled by the first control signal b applied from the control circuit 5. The first control signal b may be an N bit digital signal having a value that selects one of the resistors R1–Rn, so resister $2^N$ is connected in a bridge to a signal transmission line, i.e. the output of the variable loss attenuation circuit 2.

Because the value of the resistor R1 is the greatest among resistors R1–Rn, the attenuation factor is set at the minimum when the movable contact engages resistor R1. In other words, the level of the signal c is highest when the movable contact is in contact with the resistor R1, while the level of the signal c is stepwisely lowered as the movable contact slides on the stationary contacts toward the rightmost resistor Rn. When the movable contact engages resistor Rn the lowest resistance value, is connected in shunt with the output of amplifier 14, to provide maximum attenuation.

The level detector 7 is, for instance, an envelope detector which detects the envelope of the output signal d of the buffer amplifier 3. The output signal e of the level detector 7 is, therefore, indicative of the level or magnitude of the signal d which is recorded on a magnetic recording tape via the suitable recording head. The output signal e of the level detector 7 is integrated by integrator 8 that is periodically reset by the second control signal f from the control circuit 5. The time constant of the integrator 8 may be set at a suitable value as described infra. The voltage of output signal g of the integrator 8 is compared with the voltage of reference signal h by the comparator 9. The comparator 9 is arranged to produce a high level output signal when the voltage of the signal g is higher than that of the reference signal h. The reference signal h may be produced by a suitable voltage divider (not shown). If the voltage divider comprises a variable resistor interposed between a power source and ground, the voltage of the reference signal h may be manually adjusted if necessary.

The control circuit 5 is arranged to produce the first control signal b for controlling variable loss attenuation circuit 2 so that a suitable attenuation factor is set in accordance with information expressed in terms of the binary code and value of the first control signal b. The control circuit 5 includes a presettable counter (not shown) which counts the number of clock pulses applied from a suitable clock pulse generator which is also included in the control circuit 5 (not shown). The counter is arranged to produce an output signal when the stored number reaches a preset number. Therefore, the counter functions as a timer, providing an output signal defining a predetermined interval, and is referred to as a timer-counter. The output signal of the timer-counter is used as the second control signal f. Therefore, the integrator 8 is periodically reset with a predetermined interval. Of course the timer-counter is periodically reset in the same manner so that the timer-counter counts the same number of clock pulses repeatedly.

As mentioned hereinabove, the control circuit 5 may be a microcomputer. In this embodiment a one-chip type microcomputer is used. The microcomputer has a clock pulse generator and a programmable counter responsive to the clock pulses. Although in a preferred embodiment the microcomputer is a μPD546C I.C., sold by Nihon Denki Inc., it is to be understood that, other I.C.'s can be used instead.

Figure 3:
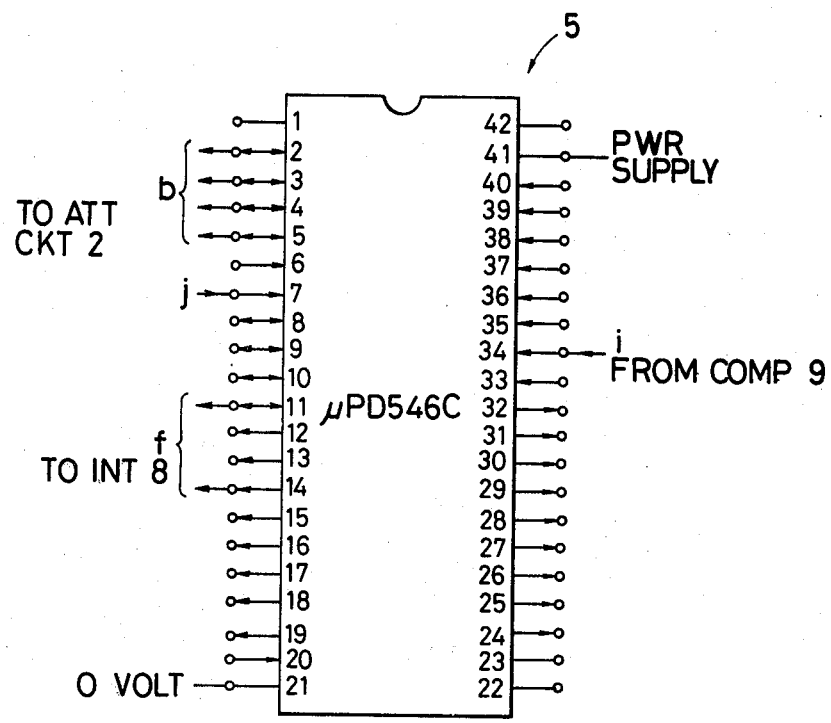
FIG. 3 is a top view of the microcomputer used as the control circuit shown in FIG. 1.

FIG. 3 is a top view of the one-chip type microcomputer, i.e. μPD546C, and the connection between the pins thereof and other circuits shown in FIG. 1.

The operation of the automatic attenuation circuit shown in FIG. 1 is described infra with reference to the flow chart shown in FIG. 4.

Upon energization of the automatic attenuation circuit shown in FIG. 1, which corresponds to "START" in the flow chart of FIG. 4, the microcomputer program enters the first step of the operating steps. The operation of the control circuit 5 automatically starts from a predetermined address. In the first step 22, the first control signal b is produced in such a manner that the attenuation factor is set at the minimum by the first control signal b. In other words, the first control signal b is arranged to include binary coded information to control analog multiplexer 16 so the minimum (lowest) attenuation factor is introduced by connecting the resistor R1 to the transmission line. In the following step 23, the second control signal f is produced by the timer-counter included in the control circuit 5. Signal f resets the output voltage of the integrator 8 to zero and starts an integration cycle. In step 24 the timer-counter reset to zero and is started so it counts the number of clock pulses from zero again. In step 25 the datum stored in the timer-counter is read. When the datum, i.e. the number stored in the timer-counter, reaches a predetermined number which has been preset in the timer-counter, the timer-counter produces an output signal. In step 26, which follows the step 25, the output signal i of the comparator 9 is detected to determine whether the voltage of the signal g is greater than the voltage of the reference signal h. If the output signal i of the comparator 9 assumes a high level, the signal g is greater than the signal h in voltage. This condition is indicated by "YES" in the flow chart, while the opposite condition, i.e. the voltage of signal g is below that of signal h is indicated by "NO".

When the answer of the step 26 is "NO", the program returns to the step 23, when the answer of step 26 is "YES", the program advances to step 27. In the step 27 the first control signal b is produced in such a manner that the attenuation factor is raised by one step. This means that the second resistor R2 in FIG. 2 is connected to the signal transmission line in place of the first resistor R1 by means of the analog multiplexer 16. After the step 27, the program returns to the step 11 during which reset signal j is detected as present or absent. If the answer of the step 11 is "YES", the step 22 follows. However, if the answer of the step 11 is "NO", the step 22 is skipped and therefore, the step 23 takes place.

In this manner the operation steps of the flow chart are repeatedly performed in sequence until the level of the output signal g of the integrator 8 becomes equal to or below the reference voltage h. When the level of the output signal g becomes equal to or below the reference voltage h, the attenuation factor of the variable loss attenuation circuit 2 is fixed by continuously connecting one resistor which has been selected from the resistors R1 to Rn. If the peak level of the input audio signal a does not exceed the level which was previously derived, the attenuation factor does not change. However, if the peak level of the input audio signal a exceeds the highest peak level which has been detected by the level detector 7, the output voltage of the integrator 8 tends to increase, and exceeds the voltage of the reference signal h. In this case the attenuation factor of the variable loss attenuation circuit 2 is further increased by one step in the way described above. Of course, if the voltage of the output signal g of the integrator 8 still exceeds the voltage of the reference signal h, the attenuation factor is successively and further increased.

It is to be noted that the attenuation factor of the variable loss attenuation circuit 2 is either fixed or changed in the direction that the attenuation factor is raised. In other words, the attenuation factor is never reduced unless the reset signal j is applied to the control circuit 5.

It will be understood from the foregoing, that if the attenuation factor of the variable loss attenuation circuit 2 is so low that the level of the input signal exceeds a predetermined level, the output level of the integrator 8 exceeds the voltage of the reference signal h before the integrator 8 is reset to zero. Accordingly, the attenuation factor is increased by one step. Since the operations indicated by the operation steps in the flow chart are performed repeatedly, the attenuation factor is stepwisely increased until the level of the recording signal d becomes equal to or less than a predetermined value. Therefore, the level of the recording signal d is set at a maximum level within a range in which the input audio signal a is barely distorted. Namely, the level of the input audio signal a is so regulated that the level of the recording signal d is maintained as high as possible.

As described hereinabove, if a variable resistor is used for producing a variable reference voltage as the reference voltage h, the level of the output signal d of the automatic attenuation circuit shown in FIG. 1 is manually controlled. Furthermore, if a variable resistor is connected to the output terminal 4, the level of the output signal d of the automatic attenuation circuit is also manually controlled.

The time constant of the integrator 8 may be suitably set in accordance with the kind of audio input signal of a program source. In other words, when it is intended to transmit a impulsive sound having a narrow width, the time constant of integrator 8 may be set at a relatively low value. In this case such impulsive signals are transmitted without or with less distortion. On the other hand, when it is intended to suppress such impulsive signals or noises, the time of integrator 8 may be set at a relatively large value. It will be understood, therefore, that the time constant of the integrator 8 may be manually set, by means of a variable resistor, in view of the kind of the programme source, the purpose of the recording and/or other conditions.

Although the automatic attenuation circuit according to the present invention has been described in connection with a preferred embodiment which is used for a tape recorder, the automatic attenuation circuit according to the present invention can be applied to other circuits or devices in which the level of an input electrical signal is required to be suitably controlled.

What is claimed is:
1. An automatic attenuation circuit comprising:
 (a) a variable loss attenuation circuit for attenuating the level of an input signal;
 (b) first means for detecting the level of the output signal of said variable loss attenuation circuit, said first means producing a signal when the magnitude of the variable loss attenuation circuit output signal is above a predetermined value, said first means having a level detector responsive to the output signal of said variable loss attenuation circuit for producing an analog signal indicative of the magnitude of said output signal, an integrator responsive to said analog signal from said level detector, means for resetting said integrator periodically to a predetermined level, and a comparator responsive to the output voltage of said integrator for detecting the level of said voltage relative to said predetermined voltage; and
 (c) second means for producing a control signal in response to the output signal of said first means, the attenuation factor of said variable loss attenuation circuit being stepwise controlled by said control signal so the level of the output signal of said variable loss attenuation circuit is equal to or below said predetermined value.

2. An automatic attenuation circuit as claimed in claim 1, wherein said variable loss attenuation circuit comprises:
 (a) an amplifier responsive to said input signal;
 (b) a resistor interposed between the output of said amplifier and the output of said variable loss attenuation circuit;
 (c) a plurality of resistors, each of which has one terminal connected to ground; and
 (d) switching means for selectively connecting one of said resistors to the output of said variable loss attenuation circuit in response to said control signal.

3. An automatic attenuation circuit as claimed in claim 1, wherein said second means comprises a microcomputer which is so programmed as to produce said control signal in accordance with the output signal of said first means.

4. An automatic attenuation circuit as claimed in claim 2, wherein said switching means comprises an analog multiplexer.

5. An automatic attenuation circuit as claimed in claim 1, wherein said level detector comprises an envelope detector for producing an analog signal indicative of the envelope of said output signal of said variable loss attenuation circuit.

6. An automatic attenuation circuit as claimed in claim 1, wherein said second means comprises a microcomputer which is so programmed as to produce said control signal in accordance with the output signal of said first means, said microcomputer comprising a timer-counter responsive to clock pulses for producing an output signal when the number stored in said timer-counter reaches a predetermined value preset in said timer-counter, the output signal of said timer-counter being fed to said integrator to reset said integrator to zero periodically.

7. An automatic attenuation circuit as claimed in claim 6, wherein said microcomputer is so programmed that the following steps are performed in a sequence;
 (a) setting the attenuation factor of said variable loss attenuation circuit at the minimum;
 (b) resetting said integrator to zero for starting integration;
 (c) resetting said timer-counter to zero for starting counting the number of said clock pulses;
 (d) waiting until the number stored in said timer-counter reaches said predetermined value;
 (e) returning to the step of resetting said integrator if the voltage of the integrator output signal is equal to or below said reference voltage;
 (f) raising the attenuation factor by one step if the voltage of the integrator output signal is greater than said reference voltage;
 (g) detecting whether a reset signal is present or not;
 (h) returning to the step of setting the attenuation factor at the minimum upon presence of a reset signal or skipping the step of setting the attenuation factor at the minimum to go to the step of resetting said integrator to zero upon absence of a reset signal.

8. In combination, an audio signal source; an automatic attenuation circuit responsive to said audio signal source, comprising:
 (a) a variable loss attenuation circuit for attenuating the level of the audio signal source;
 (b) first means for detecting the level of the output signal of said variable loss attenuation circuit, said first means producing a signal when the magnitude of the variable loss attenuation circuit output signal is above a predetermined value, said first means having a level detector responsive to the output signal of said variable loss attenuation circuit for producing an analog signal indicative of the magnitude of said output signal, an integrator responsive to said analog signal from said level detector, means for resetting said integrator periodically to a predetermined level, and a comparator responsive to the output voltage of said integrator for detecting the level of said voltage relative to said predetermined voltage;
 (c) second means for producing a control signal in response to the output signal of said first means, the attenuation factor of said variable loss attenuation circuit being stepwise controlled by said control signal so the level of the output signal of said variable loss attenuation circuit is equal to or below said predetermined value; and (d) a magnetic tape recorder head responsive to the output signal of said variable loss attenuation circuit.

9. The automatic attenuation circuit of claim 1 or 8 wherein said second means includes means for stepwise raising the control signal until the level of the output signal of said variable loss attenuation circuit is equal to or less than said predetermined value.

* * * * *